United States Patent [19]

Moser et al.

[11] 4,312,116

[45] Jan. 26, 1982

[54] METHOD OF SEALING AN ELECTRONIC MODULE IN A CAP

[75] Inventors: Floyd R. Moser, South Burlington; Richard W. Noth, Underhill, both of Vt.

[73] Assignee: International Business Machines Corporation, Armonk, N.Y.

[21] Appl. No.: 140,266

[22] Filed: Apr. 14, 1980

[51] Int. Cl.³ .............................................. H01L 1/10
[52] U.S. Cl. ..................................... 29/588; 156/330; 156/285; 156/293; 357/80; 53/423; 53/478
[58] Field of Search ........................ 156/330, 285, 293; 357/80; 29/588; 53/423, 478

[56] References Cited

U.S. PATENT DOCUMENTS

| | | | |
|---|---|---|---|
| 4,082,394 | 4/1978 | Gedney et al. | 357/80 |
| 4,159,221 | 6/1979 | Schuessler | 357/80 |
| 4,163,072 | 7/1979 | Soos | 427/96 |

OTHER PUBLICATIONS

Muenkel, IBM Tech. Dis. Bul. vol. 14, No. 10, Mar. 1972, p. 2868.
DeRobertis et al., IBM Tech. Dis. Bul. vol. 22, No. 1, Jun. 1979, pp. 91-92.
Schuessler, IBM Tech. Dis. Bul. vol. 18, No. 6, Nov. 1975, p. 1796.
Robbins, IBM Tech. Dis. Bul. vol. 18, No. 8, Jan. 1976, p. 2470.
Amaro et al. IBM Tech. Dis. Bul., vol. 18, No. 3, Aug. 1975.
Christie et al. IBM Tech. Dis. Bul., vol. 19, No. 1, Jun. 1976.

Primary Examiner—Norman Morgenstern
Assistant Examiner—Richard Bueker
Attorney, Agent, or Firm—William N. Hogg

[57] ABSTRACT

A method of packaging an electronic module in a cap is disclosed. The module, comprising one or more silicon chips mounted on a substrate and having the chips sealed onto the substrate with a silicone polymer is supported on a cap with the chips disposed inwardly. An epoxy is dispensed on the back surface of the substrate and allowed to flow and bridge over the gap between the substrate and cap. The epoxy is cured by first heating the assembly with the applied epoxy to a temperature which will gel the epoxy. The temperature and rate of heating are selected so that the temperature is stabilized before the critical viscosity of the epoxy is reached. Subsequently, a higher temperature is used to complete the cure. The process is also characterized in that no significant decrease in temperature is permitted after the dispensing and flowing of the epoxy.

7 Claims, 4 Drawing Figures

METHOD OF SEALING AN ELECTRONIC MODULE IN A CAP

BACKGROUND OF THE INVENTION

This invention relates generally to the packaging of electronics, and more particularly, to the packaging of modules comprising silicon chips mounted on a substrate in a cap.

In one conventional packaging technique for silicon chips having integrated circuits thereon, the chips are first mounted on a ceramic substrate, and a sealant is applied over the chips causing the chips to be sealed onto the substrate. This constitutes what is known as a module. This module of one or more chips mounted on a substrate is then mounted in a cap with the chips facing inwardly. This mounting is accomplished by supporting the module in the cap, dispensing an epoxy onto the back surface of the module, allowing the epoxy to flow around the edges to seal the module into the cap, and thereafter curing the epoxy.

It has been found that a very desirable overcoat for covering the chips on the substrate is a silicone polymer. However, when utilizing this technique of mounting the modules onto caps with an epoxy when a silicone polymer has been used as a sealant around the chips, several rather serious problems have been encountered. One of these problems is characterized by bubbles having a tendency to form in the epoxy during conventional curing techniques. This formation of bubbles constitutes a product defect and requires the discarding of the assembled module and cap. It has been determined that the bubble formation is not caused by gas entrapped in the epoxy during dispense but rather is generated by the silicone polymer and this together with the air entrapped inside the cap during the curing cycle is forced into the epoxy and in many instances remains in the epoxy after it has completed its cure thus constituting a product defect.

Another problem which has been encountered when silicone polymer is used as an overcoat around the chips is that the epoxy during the curing cycle in some cases has been sucked inside the cap and in such instances will tend to displace the silicone polymer, with the epoxy working its way around the chip or chips. Subsequent heating and cooling cycles can cause the epoxy to expand and contract to such a degree that it will loosen the chips from the substrate. Another type of reliability defect encountered in the past due to "epoxy suck in" has to do with a "stacked" module. In this case the epoxy, when sucked in, forms a solid bridge between the two ceramic substrates and subsequent thermal cycling causes the epoxy to expand and contract thus causing the ceramic substrates to separate.

SUMMARY OF THE INVENTION

According to the present invention, an improved process for sealing modules in a cap is provided which eliminates the problems of bubbles being trapped in the epoxy during curing and also prevents the epoxy from being drawn inside the cap and interfering with the silicon chip. According to this technique a module containing a chip on the substrate with a cured silicone polymer sealant applied over the chips is supported in a cap with the chips facing inwardly. The epoxy is applied to the exposed back surface of the module, the epoxy being dispensed at a temperature which will allow it to flow to seal around the edges of the module and the cap. The module and cap with the applied epoxy are then heated to and maintained at a temperature until the resin gels. This temperature and rate of heating is selected to allow essentially complete outgasing and stabilizing of the pressure within the cap before the critical viscosity of the epoxy is obtained to thereby prevent bubble entrapment in the epoxy. Thereafter, the heating is continued to a higher temperature to complete the cure of the epoxy. This will prevent any gas bubbles being entrapped within the epoxy after it is cured. The bubbles are prevented from being entrapped because the outgasing has been essentially completed before the critical viscosity of the epoxy is reached thereby allowing the gas which is being generated and expanded during heating to escape through the epoxy, and the temperature and pressure are stabilized before the critical viscosity is reached. This critical viscosity is defined as that viscosity below which gas can freely escape therefrom and above which any gas that enters will be entrapped and not escape.

The process is further characterized by preventing any decrease in temperature subsequent to dispensing of the epoxy and prior to the obtaining of the gel point. This will prevent any of the epoxy from being sucked into the interior of the cap due to a decrease in air pressure caused by a reduction in temperature. Hence, epoxy will not be inside and cannot contact the silicon chip by displacing the silicone polymer.

Other objects and advantages of the invention will become apparent from the following descriptions of the drawing and preferred embodiment.

DESCRIPTION OF THE PREFERRED EMBODIMENT

Figure 1:
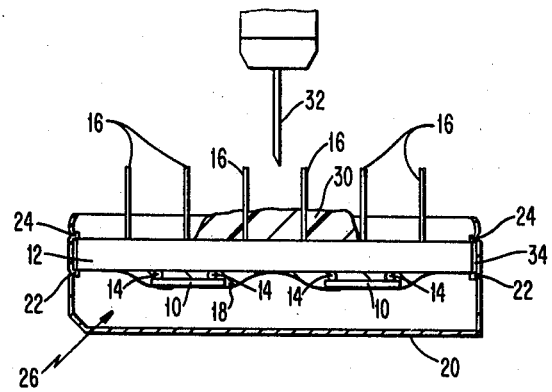
FIG. 1 is a side elevational view partially in section of a module supported in a cap with epoxy being dispensed onto the back surface of the module.
Figure 2:
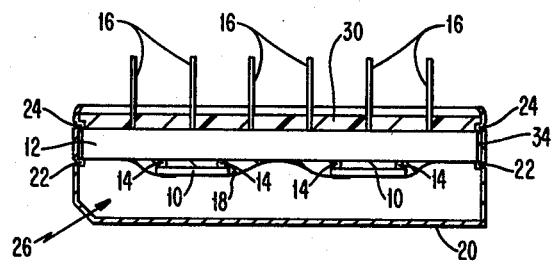
FIG. 2 is a side elevational view partially in section of a completed assembly of a module sealed in a cap with epoxy.
Figure 3:
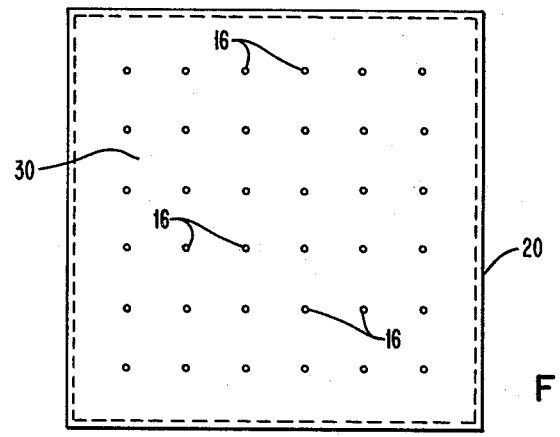
FIG. 3 is a plan view of the assembly of FIG. 2.

Referring now to the drawing, and for the present to FIG. 1, a module and a cap are shown assembled ready for the module to be sealed into the cap with epoxy according to the present invention. The module is a conventional module well known in the art and includes a pair of silicon chips 10 having integrated circuits thereon mounted onto a ceramic substrate 12 by conventional metal connections 14. (There can be more, or less, than two chips mounted on the substrate.) Pins or posts 16 extend from the substrate 12 and are adapted to connect the module to cards or boards or other external power supplies. A coating 18 of a silicone polymer is applied over the chips 10 to seal the chips on the substrate. One very good silicone polymer for this surface is a product sold by Dow Corning under the Tradename "Sylgard". The silicone polymer 18 is cured according to conventional techniques before the module and cap are assembled according to the present invention.

As can be seen in FIG. 1, a cap 20 formed of aluminum is provided which has indentations 22 formed thereon to support the substrate 12 and small kerfs of dimples 24 are also provided to hold the module in place during the operation of applying and curing the epoxy.

Holding the module in place is also done by bending the skirt of the aluminum cap over onto the ceramic substrate. The substrate is first rested on indentations 22 and then a tool is used to form the kerfs 24 which will maintain the substrate in the proper position for the application of the epoxy. As can be seen the module is mounted so that the chips are disposed inwardly within space 26 inside the cap 20.

Still referring to FIG. 1, the epoxy sealant material, designated by reference character 30, is dispensed onto the back side of the substrate 12 from a dispensing needle 32. Preferably the assembled module and cap are maintained at room temperature and the epoxy is heated to about 55° C. This heating is merely for the purpose of obtaining a proper viscosity of the epoxy to allow it to spread over the back side of the module and seal around gap 34 between the edge of the cap 20 and the edge of the substrate 12. This gap 34 has a width of about 1 to 5 mils.

A preferred epoxy is an epoxy sold by 3M Company under the trade designation Scotchcast 5239 and has a mix ratio of about 46% resin by weight, 52% hardener by weight, and about 2% dye by weight. This is a preferred epoxy although other epoxies as well as other mix ratios will work. It has been found, however, that this Scotchcast 5239 with this particular mix ratio gives excellent results and the epoxy as applied will flow across the substrate and bridge across the gap 34 between the substrate 12 and the cap 20. The temperature difference between the epoxy and the room temperature of the module will stabilize or equalize rather quickly inasmuch as the epoxy constitutes only 10% or less of the mass as compared to the chip, substrate and cover.

As indicated above, once the epoxy has been applied and spread to bridge across gap 34 it is important that the temperature of the module and the cap with the applied epoxy not be reduced by any appreciable amount, i.e., the temperature should not be reduced any more than 5° C. The reason that the temperature should not be reduced is that any appreciable reduction in temperature, i.e., more than about 5° C., will cause an appreciable reduction in the gas pressure in space 26. A significant reduction in pressure will tend to suck in the liquid epoxy from the gap 34. As indicated above, the epoxy sucked in will tend to displace the silicone polymer and work its way around the chips. Subsequent heating and cooling of the epoxy can cause significant expansion and contraction and allow the epoxy to damage the chips 10 or their mounting on the substrate 12. Thus, it is important that there be no substantial reduction in temperature after the epoxy has been applied to the substrate and spread over the gap 34. For this reason it is desirable to apply the epoxy to the substrate while the substrate and cap are being maintained at room temperature so that if necessary they can be stored without the need for reduction in temperature.

After the epoxy has been applied and is dispersed over the back of the substrate 12 and bridges the gap 34, the epoxy is then cured with very closely controlled rates and temperatures. The curing of the epoxy must be very closely controlled to the following parameters otherwise there is a very high likelihood of the gas generated within the space 26 becoming entrapped in the epoxy which bridges the gap 34, as the epoxy passes through the critical viscosity point if the temperature is not first stabilized as will be explained presently.

Figure 4:
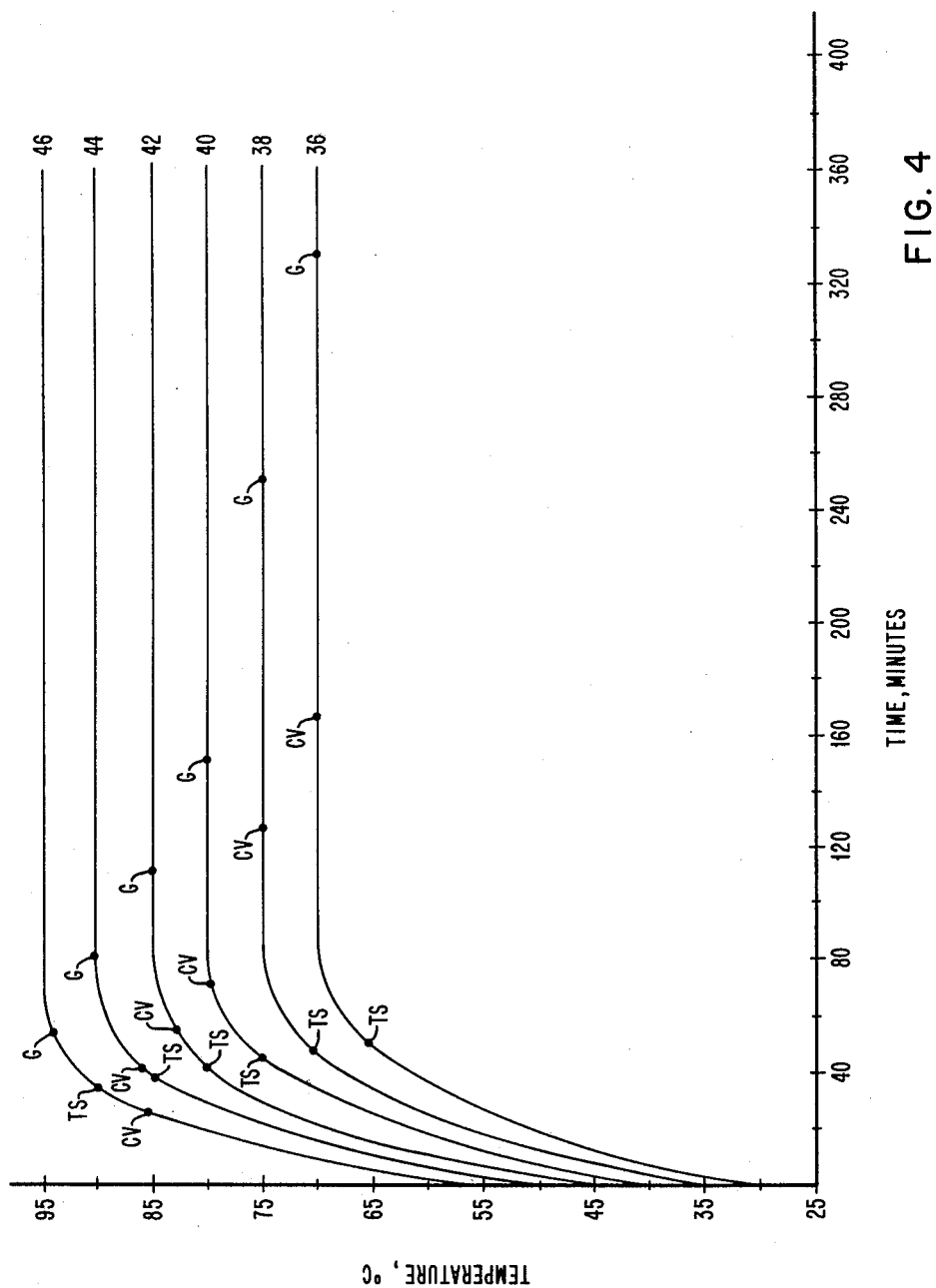
FIG. 4 is a graph showing temperature profiles of modules and caps with epoxy thereon, heated to various temperatures and indicating certain critical points on each profile curve.

In curing the epoxy, the module and the cap with the applied epoxy are heated to and maintained at a preselected temperature in an initial heating step until the epoxy gels. This temperature and rate of heating is selected to allow essentially complete outgasing and stabilizing of the pressure within the cap before the critical viscosity of the epoxy is attained. Thereafter, the partially cured assembly is heated to a higher temperature to complete the cure of the epoxy. The curves shown in the graph of FIG. 4 are temperature profiles of the initial heating step showing the various critical points on each of the curves.

Curve 36 shows the profile of heating to 70° C. This shows the temperature profile of a module and a cap having epoxy dispensed thereon and placed in an oven preheated to 70° C. In all cases the temperature profile curves are for this particular experimental procedure; i.e., the module and caps are assembled as previously described, the epoxy dispensed at about 55° C. and allowed to bridge the gap 34. Thereafter, the cap and module with the dispensed epoxy are placed into the oven preheated to the indicated temperature. As can be seen in FIG. 4, the temperature of the assembly with the epoxy thereon rises, the temperature rise being plotted on the vertical axis and time being plotted on the horizontal axis. The rise in temperature is such that eventually the temperature of the assembled module and cap with the epoxy attains that of which the oven is heated. It will be noted that on the profile curves there are three points designated. One point designated G is the gel point of the epoxy, the point noted CV is the critical viscosity point, and the point noted as TS represents the temperature stabilization point. The gel point of the epoxy is a well known and well recognized point and is generally defined as that condition obtained by material wherein it is of a gel like consistency and is essentially able to support its own weight without flowing under the force of gravity. The gel point of a material can be determined in many ways. For the purpose of the present invention, the gel point was measured on a "gel meter" manufactured by Sunshine Scientific Instruments Company of Philadelphia, Pa. Other instruments are readily available; however, this particular instrument provides a relatively simple technique of determining the gel point of a resin.

The temperature stabilization point for the purpose of the present invention is defined as a temperature about 5° C. below the final temperature to which the assembly and epoxy is heated during this first step. Therefore, the temperature stabilization point for the curve 36 which represents a final temperature of 70° C. is about 65° C. It has been found that once the temperature of the gas has come to within 5° C. of the ultimate temperature it can be considered essentially stabilized in that further outgasing of the gas within the space 26 will not occur through the epoxy in the gap 34. Thus, for the present invention, the temperature stabilization point is defined as that temperature which is 5° C. below the temperature which is finally reached in this stage.

The critical viscosity point is also shown on each curve. Critical viscosity point is defined as that point wherein the viscosity of the epoxy is such that any gas trapped therein cannot escape but will be retained within the epoxy and form a gas bubble. The prevention of these entrapped gas bubbles is one of the principal aspects of the present invention. It has been found that the critical viscosity is reached at about one-half the time it takes to reach the gel point of the epoxy. Therefore, for the purpose of the present invention, the critical viscosity point of the epoxy is that point in this part of the curing cycle which represents the viscosity of the epoxy at approximately one-half the time at which the gel point is reached. This is shown as point CV in the curve 36. As can be seen from examining curve 36 (which sometimes may be referred to as the 70° C. curve) the temperature stabilization point is reached well before the critical viscosity of the resin is reached; hence, the 70° C. cure in the initial cycle would be within the purview of the present invention. Similarly, it can be seen that in the case of the curve 38 which represents a 75° C. cure, curve 40 which represents the 80° C. cure, and curve 42 which represents the 85° C. cure, in each case the temperature stabilization point is reached before the critical viscosity is reached and, thus, these curing cycles of 75° C., 80° C. and 85° C. are clearly within the purview of the present invention.

With respect to the curve 44, or 90° C. curve, it can be seen that the temperature stabilization and critical viscosity point are reached at almost the same time. Thus, the 90° C. curve represents essentially the limit for the present invention. In the curve 46, or the 95° C. curve, the critical viscosity is reached before the temperature stabilization point and thus the 95° C. curve is outside the present invention.

As is indicated above, once the gel point of the epoxy has been reached, the curing is completed by heating the epoxy to more elevated temperatures. This will decrease the time needed to complete the curing. It should be noted that once the gel point has been reached, a higher temperature will not have a deleterious effect even though this increases the generation of and pressure of the gas in space 26 since the gas cannot be driven into the epoxy once it has passed the gel point. Thus, the epoxy will not be adversely affected here by an increase in gas pressure.

The preferred completion of the cure cycle is accomplished in two steps. The parts are heated to 100° C. for about four hours and thereafter heated to 150° C. for an aditional four hours. The parts can then be slow cooled by leaving them in the oven or they can be removed from the oven.

As a practical matter, it is desired to perform the initial curing step at as high a temperature as is practical without causing defects. The reason for this is obvious upon examination of the curves in FIG. 4 wherein it shows that as the initial cure temperature increases from 70° C. to 95° C. the gel time is substantially reduced from something over 300 minutes to less than 60 minutes. It has been found that an optimum temperature for initial step in the cure cycle is about 86° C. This allows a relatively rapid reaching of the gel point, but still attains a temperature stabilization point before the critical viscosity of the epoxy. In any event a final temperature in this initial stage should be less than 90° C.

It should be understood that the limits set herein are limits which will assure the final product is free of deleterious gas entrapment in the epoxy disposed around the gap 34 in virtually all cases. If the limits are exceeded slightly, i.e., if the temperature in the initial stages is slightly over 90° C. it does not mean that in all cases there will be gas entrapped in the epoxy but it does mean that in a significant number of cases gas will be entrapped causing a significant number of unsatisfactory parts. As the limits are further exceeded, there will be a greater tendency toward unsatisfactory parts.

What is claimed is:

1. In the packaging of a module comprising at least one silicon chip mounted on a ceramic substrate, wherein a silicone polymer has been applied around each chip on the substrate and has been cured, and said packaging includes the step of mounting said module in a cap member wherein the cap member encloses said module around the edges thereof with the chips directed inwardly and the back surface of the module being exposed outwardly, the improvement which comprises, applying an epoxy to said exposed back surface of said module, said epoxy being dispensed at a first temperature at which the epoxy flows to seal around the edges of said module and said cap;

thereafter, heating the module and cap with the applied epoxy to a second temperature and maintaining said second temperature until said epoxy gels, said second temperature and rate of heating being selected to allow essentially complete outgassing and stability of the pressure within the cap before the critical viscosity of the epoxy is attained; and thereafter heating to a higher temperature to complete the cure;

said process being further characterized by preventing any decrease in temperature subsequent to the dispensing and flow of the epoxy and prior to the attaining of the gel point.

2. The invention as defined in claim 1 wherein said first named temperature is less than 90° C.

3. The invention as defined in claim 1 wherein said first named temperature is about 86° C.

4. The invention as defined in claim 1 wherein the heating to said second temperature includes two heating steps.

5. The invention as defined in claim 4 wherein said first subsequent heating step is to about 100° C. and said second subsequent heating step is to about 150° C.

6. The invention as defined in claim 3 wherein the heating to said second temperature includes two heating steps, the first to about 100° C. for about four hours and the second to about 150° C. for about four hours.

7. The invention as defined in claim 1 wherein said epoxy is heated to about 55° C. when it is applied to said back surface.

* * * * *